US006297066B1

(12) United States Patent
Sacher (10) Patent No.: US 6,297,066 B1
(45) Date of Patent: Oct. 2, 2001

(54) COATING PROCESS AND APPARATUS (76) Inventor: Joachim Sacher, Am Kähnelplatz 8, 35041 Marburg (DE)

( * ) Notice: Subject to any disclaimer, the term of this patent is extended or adjusted under 35 U.S.C. 154(b) by 0 days.

(21) Appl. No.: 09/263,481

(22) Filed: Mar. 8, 1999

(30) Foreign Application Priority Data

Mar. 21, 1998 (DE) .......................................... 198 12 562.3

(51) Int. Cl.$^7$ .................................................. H01L 21/66
(52) U.S. Cl. .................................................. 438/14; 438/38
(58) Field of Search .................................. 438/38, 22, 5, 438/7, 10, 14, 16, 17, 958

(56) References Cited

U.S. PATENT DOCUMENTS

| 5,024,853 | * | 6/1991 | Landreau . | |
| 5,221,636 | * | 6/1993 | Landreau . | |
| 5,354,575 | * | 10/1994 | Dagenais et la. | 427/10 |
| 5,550,089 | * | 8/1996 | Dutta et al. | 438/38 |
| 5,597,768 | * | 1/1997 | Passlack et al. | 438/58 |

* cited by examiner

*Primary Examiner*—Savitri Mulpuri
(74) *Attorney, Agent, or Firm*—Klaus J. Bach (57) ABSTRACT

In a process and apparatus for coating the front and/or rear facets of semiconductor laser diodes with antireflection layers of minimal reflectivity, the coating material is deposited on the facets while at least one laser parameter is monitored, in-situ, for determining the coating thickness of the individual antireflection layers resulting in the minimum reflectivity of the coating and the respective coating procedure is terminated when the laser parameter indicates that such coating thickness has been reached.

6 Claims, 11 Drawing Sheets

COATING PROCESS AND APPARATUS

The present invention resides in a process of coating semiconductor lasers with antireflection layers (called below AR-layers) with in-situ monitoring of the laser light emitted from the front facet and/or the rear facet of a laser, the electric voltage at the p-n junction of the laser or the quantum efficiency of the laser light emitted from the front and/or rear facet of the laser.

Mirror-less semiconductor laser diodes are utilized in modern optical measuring instruments for the gas analysis and interferometry or as optical radar. They are also used in the field of active light amplification Because of the refraction index change between laser material and the ambient, the mirror facets of semiconductor lasers have a reflectivity of typically 32%. A common procedure for reducing the reflectivity of one or both of the laser facets resides in coating the facets with a dielectric layer having a thickness corresponding to one fourth of the center wave length of the laser. The value of the refraction index is selected according to the harmonic medium of the refraction index of the laser material and of the surroundings. With a suitable control of the thickness and the value index of the antireflection layer, values for a minimal rest reflectivity smaller than $10^{-5}$ can be achieved. Several methods have been described in the literature for achieving this result.

M. Serenyi and H. J. Habermeier describe in "DIRECTLY CONTROLLED DEPOSITION OF ANTIREFLECTION COATINGS FOR SEMICONDUCTOR LASERS", Applied Physics, Vol. 26, (1997), pages 845 ff, a process, wherein a laser is electrically operated and the emitted light energy is observed. The coating procedure is ended when the light output reaches the minimum.

In a process as described by J. Landreau and H. Nakajima in "IN-SITU REFLECTIVITY MONITORING OF ANTIREFLECTION COATINGS ON SEMI-CONDUCTOR LASER FACETS THROUGH FACET LOSS INDUCED FORWARD VOLTAGE CHANGES", Applied Physics letters, Vol. 56 (1990), pages 2376 ff, the laser is electrically operated and the voltage at its p-n-junction is observed. The coating procedure is terminated when the voltage at the p-n-junction reaches a maximum.

In the article, "REAL-TIME IN-SITU MONITORING OF ANTI-REFLECTION COATINGS OF SEMICONDUCTOR LASER AMPLIFIERS BY ELLIPSOMETRY", Annual Meeting of the IEEE Lasers and Electro-Optics Society (LEOS), November 1991, M. Dagenais and I-Fan Wu present a process wherein the laser is electrically operated and the current threshold of the laser during coating is observed. The coating procedure is terminated when the current reaches its maximum threshold value.

The theoretical curve for the laser characteristic values is obtained from the stationary solution of the laser equations. To determine the optical laser characteristic values also the outcoupling rate which is changed by the antireflection coating needs to be taken into consideration. Altogether, the following relationships are obtained:

$$P = \frac{J - \gamma \cdot N + \frac{\gamma \cdot K}{G_N}}{\Gamma + K}$$

$$K = -\vartheta_g \frac{\ln(1 - r_2)}{2L}$$

$$I_{th} = \gamma \cdot N + \gamma \cdot \frac{K}{G_N}$$

$$L - r_2 = \frac{(1 - r_{12}^2)(1 - r_{23}^2)}{1 + r_{12}^2 \cdot r_{23}^2 + 2r_{12}r_{23} \cdot \cos 2\beta}$$

$$\beta = 2\pi \cdot \frac{n_2 \cdot h(1)}{\lambda}$$

Herein are:
P is the light energy emitted from the rear side laser facet, J is the normalized threshold current density, $\gamma$ is the electron disintegration rate, N is the transparency charge carrier density, $G_N$ is the differential gain, $I_{th}$ is the normalized threshold current density of the laser, $V_g$ is the group speed of the light, and L is the length of the laser. $r_{12}$ is the reflectivity of the interface between the AR layer and the laser, $r_{23}$ is the reflectivity between the AR layer and the surroundings; $n_2 h$ is the optical layer thickness of the antireflection layer with the refraction index $n_2$ and the geometric thickness h, and $\lambda$ is the center wave length of the laser. The other laser parameters can be determined by way of the same formalism.

The method of monitoring in-situ the laser characteristic values during the application of antireflection coatings to semiconductor diodes is limited generally to the coating of small numbers of semiconductor diodes. One reason herefor resides in the fact that the time period required for generating a suitable vacuum is much greater than the time required for the coating of the individual laser diodes. To satisfy the demand for large numbers, however, rapid coating processes are needed which provide for highest quality and the highest possible efficiency.

The process proposed in U.S. Pat. No. 3 846 165 by M. Ettenberg et al., to use a single laser as a monitor laser and to coat simultaneously several lasers or laser bars, facilitates the manufacture of large numbers of antireflection structures. But the resulting lasers are not suitable for many applications. For highest quality requirements, this method is therefor not suitable. The reasons are different thicknesses in the facet passivation (initial coating) of commercially available semiconductor lasers, spatial variations of the coating grown with regard to the thickness and values of the refraction index.

Modern high power lasers include generally an antireflective layer on the laser facet with a reflectivity of typically 5% to 10%. The best antireflection properties can therefore not be obtained by the deposition of only a single antireflection layer. To obtain highly effective antireflection layers, it is therefore necessary to either remove the initial coating or to deposit at least two layers having a different thickness and a different refraction index. In the publication of M. Dagenais and I-Fan Wu mentioned earlier, M. Dagenais and I-Fan Wu have proposed to use an in-situ ellipsometer for controlling the process of removing the initial coating or, respectively, to control the grown layer thicknesses. However, besides the fact that this process requires the use of a very expensive measuring apparatus, the apparatus must be adjusted to a measuring area of typically 10 $\mu$m×10 $\mu$m, which is not economical.

It is an important object of the present invention to provide a method and apparatus for the manufacture of antireflection layers on semiconductor diodes, which are manufactured in high numbers and by efficient means. Particularly, the rest reflectivity is to be greater that $10^{-5}$.

SUMMARY OF THE INVENTION

In a process and apparatus for coating the front and/or rear facets of semiconductor laser diodes with antireflection layers of minimal reflectivity, the coating material is deposited on the facets while at least one laser parameters is monitored, in-situ, for determining the coating thickness of the individual antireflection layers resulting in the minimum reflectivity of the coating and the respective coating procedure is terminated when the laser parameters indicate that such coating thickness has been reached.

In a particular embodiment, the method for producing AR layers is based on in-situ observation of the light emitted from the front facet and/or the rear facet of the laser diode, the electric voltage at the p-n junction of the laser, or the quantum efficiency of the laser light emitted from the front or rear facet of the laser, or of the threshold current of the laser. The method requires that the thickness of the AR layer is determined by the value changes of a laser parameter as observed in situ. The measurement values determined in-situ, are compared, for example, with the theoretical values according to equation (1) or equation (2) and, herefrom, the thickness of the respective partial layer is directly determined. This highly efficient procedure does not only omit the need for expensive and complicated measuring apparatus such as in-situ ellipsometer, but improved results are obtained since the laser to be coated is itself used as measuring instrument. The present invention permits the manufacture of antireflection coatings in large numbers and with the highest quality. The new process is not only applicable to the thickness of the previously applied layer; rather, the process according to the invention can also be used with any partial layer particularly by plotting a time behavior comparison.

Various laser parameters can be used in connection with the method according to the invention. These are specifically the energy of the light emitted from the front and rear facets of the laser, the quantum efficiency of the light emitted from the front and rear facets of the laser, the wave length of the light emitted by the laser, the electric voltage at the p-n junctions of the laser and the threshold current of the laser. It is within the scope of the present invention to utilize one or several of the laser parameters for determining the coating thickness of one or of several partial layers.

The invention also leads to an efficient manufacture of large numbers of AR coatings of high quality. Several lasers can be disposed in one container. While the quality of the coating of a single laser is surveyed, a number of other lasers may be treated at the same time in an identical manner. This procedure is different from the process according to Ettenberg et al., described earlier in that, there, exclusively the minimum of the light energy is observed whereas, in the present case, the complete laser behavior is considered. As a result, in contrast to the state of the art process, quality results are obtained which meet highest requirements.

A substantial improvement is achieved if all the lasers are coated together at the same time up to a safe value of the layer thickness whereupon the coating procedure continues for each individual layer with an in-situ observation of one or more laser parameters. In this way, the high quality obtained by individual observation is transferred to a large number production as, at the critical stage, all lasers are treated individually.

The lasers may have various shapes. They may be standard lasers or they may be special lasers. A laser may be completely finished so that it can be operated as a laser in the receiver, whereas the other lasers are unfinished products. The unfinished lasers may be in the form of chips or in the form of bars.

An apparatus for the coating of lasers preferably includes a receiver including at least a coating source, support structures for supporting the semi-conductors, shutters, a control and measurement unit and connecting lines. This apparatus includes for each coating source at least one movable laser support for coating a laser diode. In front of the laser support, there is at least one shutter by which the laser or lasers can be selectively subjected to the coating process, which can be done individually or in unison.

The receiver includes a storage section in which the lasers to be coated or, respectively, the already coated lasers are contained which have to be transferred to the coating section of the receiver. These components-storage and coating sections may be identical in design.

For the transfer of the lasers, a pivotable and/or slidable shutter support structure may be disposed adjacent the coating section. In this way, the laser storage section becomes a part of the coating chamber. No expensive motordriven slides or similar mechanisms are needed.

It is very important for the process according to the invention how the laser is arranged relative to coating source. The arrangement is suitably adapted to the coating parameters, particularly the deposition rate and the refraction index. It is particularly advantageous if all the lasers are disposed along a line defining an identical deposition rate and an identical refraction index. Often the deposition parameters are symmetrical with respect to the coating source. The lasers are therefore preferably arranged in a circle around the coating source. In this way, each laser is subjected to the same deposition rate and the layers deposited on the lasers have the same refraction index. It is also possible that the deposition parameters have a linear symmetry over a certain area. In this case, the lasers should be arranged linearly.

During the antireflection coating process, one or several shutters may be moved in front of the lasers. This may be done to optimize the coating of the lasers as, during the deposition process, particular lasers or all of the lasers with the exception of one can be covered by the shutters.

During the deposition process, several lasers may be electrically operated for measuring or respectively, observing the laser parameters. At least in one or preferably in several or all of these lasers, the laser parameters are monitored continuously or discretely such that the process can be performed efficiently and accurately.

For controlling the process, there are provided control and measuring devices which include laser control means, controls for the operation of the shutters in the receiver, a layer control as well as a vacuum control arrangement. The electronic control equipment is preferably disposed in a separate control box or cabinet and is in communication with the coating source, the laser support and/or the shutter support structure in the receiver by way of electrical and/or optical lines.

Various features and advantages of the invention will become more readily apparent from the following description of various embodiments of the invention on the basis of the accompanying drawings.

DESCRIPTION OF PREFERRED EMBODIMENTS

Figure 1:
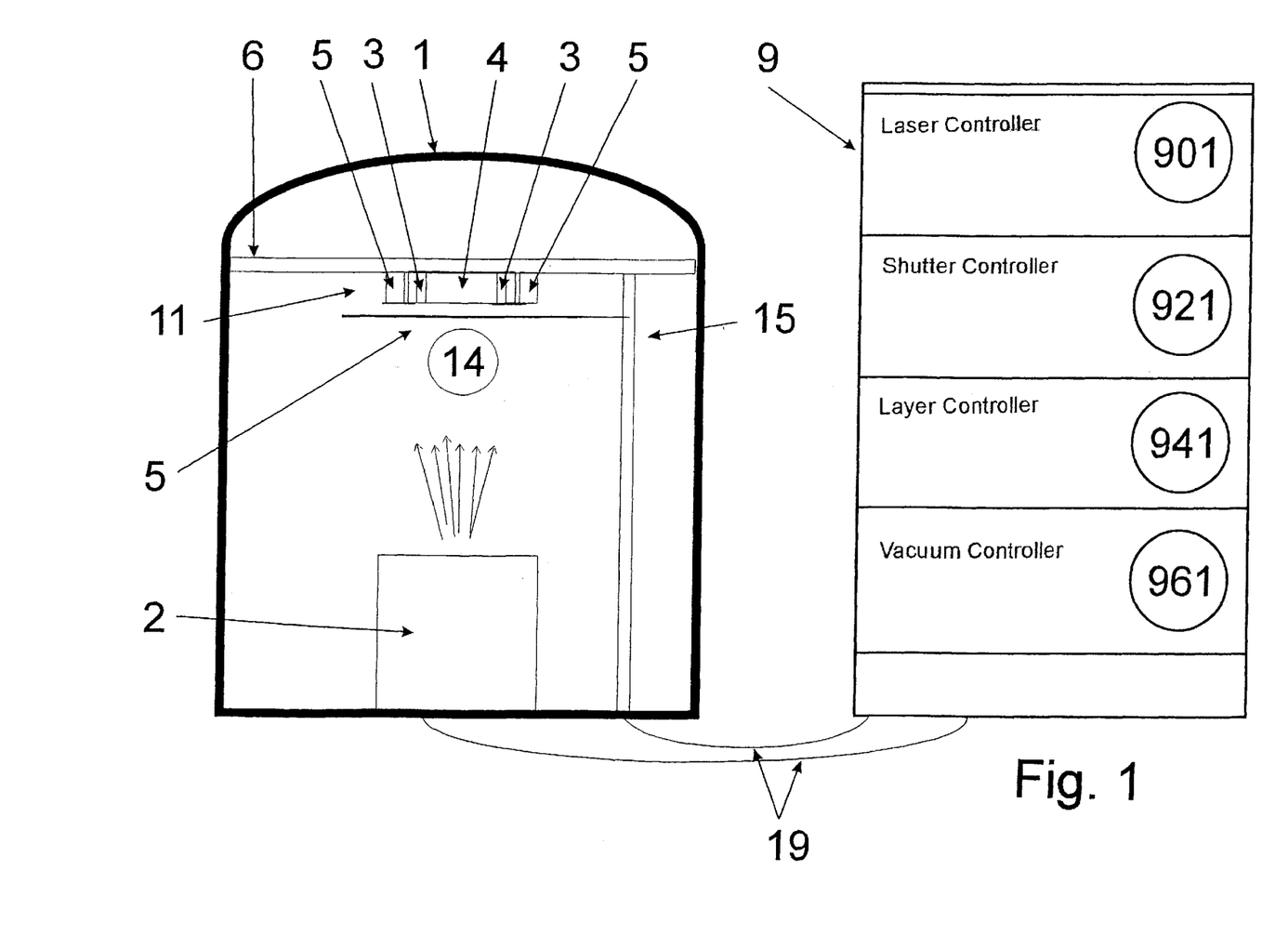
FIG. 1 is a schematic representation of a coating apparatus for semiconductor lasers.

FIG. 1 shows schematically a coating apparatus for semiconductor lasers. It comprises a receiver 1, in which the coating process takes place, and a control and measuring arrangement 9, which controls all the process-related parameters. In the embodiment, the receiver 1 is divided into an upper storage section 11 and a coating process section 14 disposed below the storage section 11. In the coating process section 14, a coating source 2 is disposed at the bottom of the receiver 1. Semiconductor lasers 3 are supported on a laser support structure 4, which is disposed on a carrier plate 6. The semiconductor lasers 3 are covered by at least one shutter 5, which is mounted on a support structure 15 and by which individual lasers can be covered or exposed. In addition, the complete laser unit 3, 4 can be covered by a shutter 7. A control unit 9, which is disposed in a control cabinet (not shown), is of modular design. As shown schematically at the right side of FIG. 1, it includes a laser control unit 901, a shutter control unit 921, a layer control unit 941 and a vacuum control unit 921, a layer control unit 941 and a vacuum control unit 961. These units are operatively connected to the coating source 2, the laser support structure 4 and/or the shutter support structure 15, for example, by electrical and/or optical conductors 19.

Figure 2A:
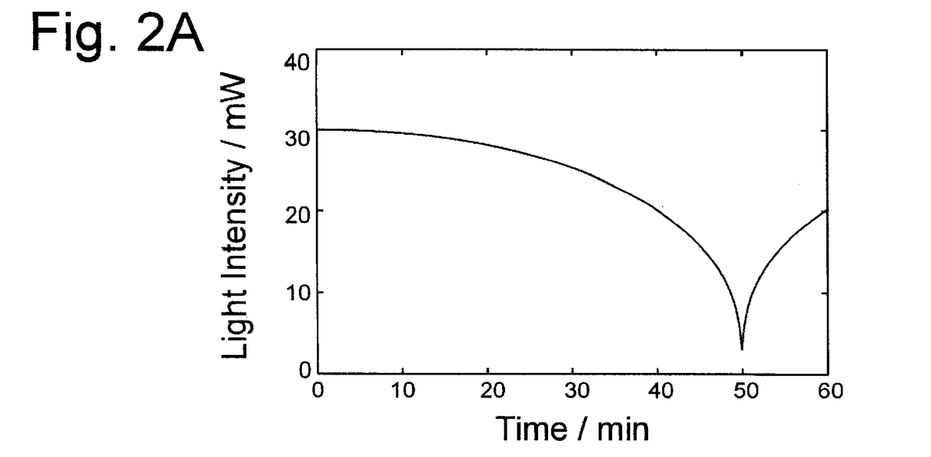
FIG. 2A is a graph showing the light energy output of a laser during antireflection coating.
Figure 2B:
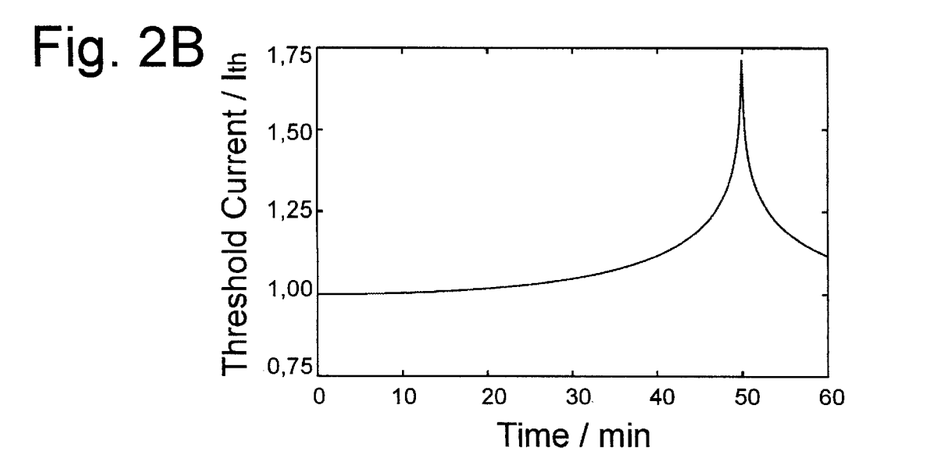
FIG. 2B shows the current threshold of a laser during antireflection coating.
Figure 2C:
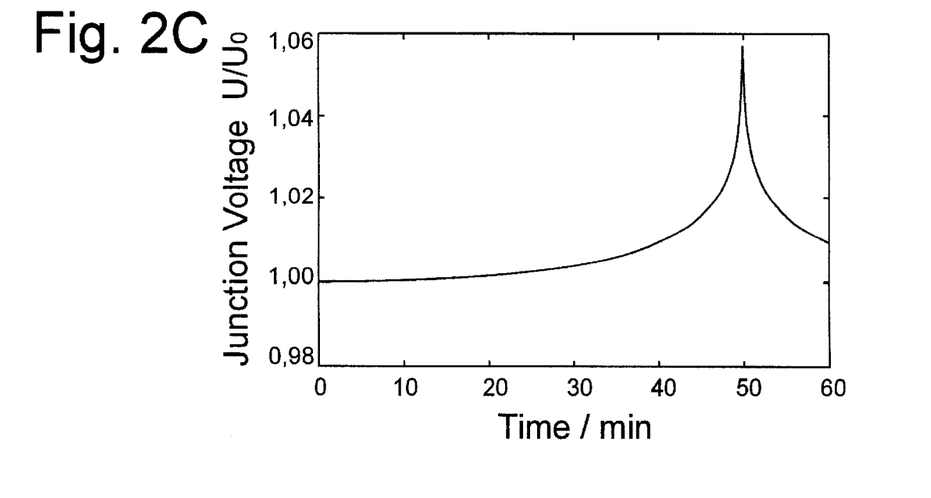
FIG. 2C is a graph showing the voltage at the p-n-junction of a laser during antireflection coating.

FIGS. 2A, 2B, 2C are typical plots of laser parameters over the coating time t during an antireflection coating process. FIG. 2A shows, time dependent, the light emission P for a single layer antireflection coating deposition. The best value for the antireflection coating is at the minimum of the curve. FIG. 2B shows, time-dependent, the threshold current I for a single layer antireflection coating procedure. The best value is achieved at the curve maximum. FIG. 2C represents the voltage U at the p-n- junction of the laser on a time-dependent basis also for a single layer antireflection coating procedure. Again, the best value is obtained at the curve maximum.

Figure 3A:
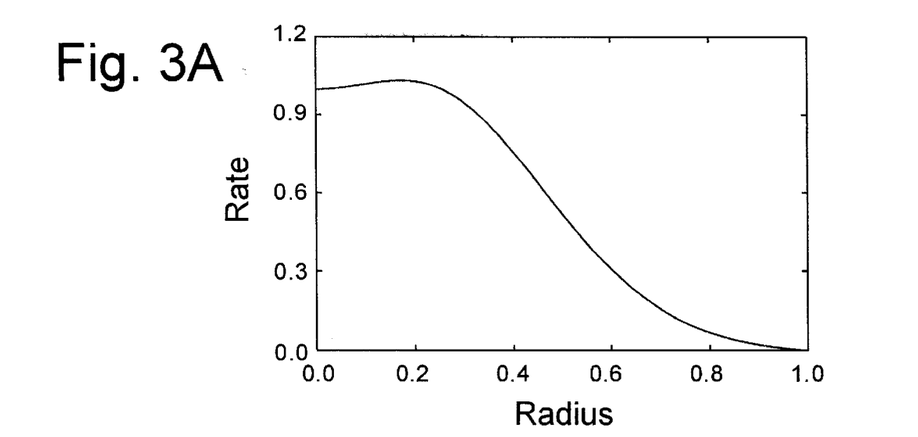
FIGS. 3A–3C are schematic representation of the growth rate of coatings with radially symmetrical and, respectively, linear coating parameters.

FIGS. 3A, 3B, and 3C show the growth rate R as a function of the location relative to the coating source. FIG. 3A shows the coating rate dependent on the radius of a laser support structure, which is radially symmetrical to the coating source. The curve shows a high dependency of the growth rate on the radius. It is therefore proposed in accordance with the invention to arrange the lasers along a circle, which defines the locations with the same growth rate (see FIGS. 5 to 7).

Figure 3B:
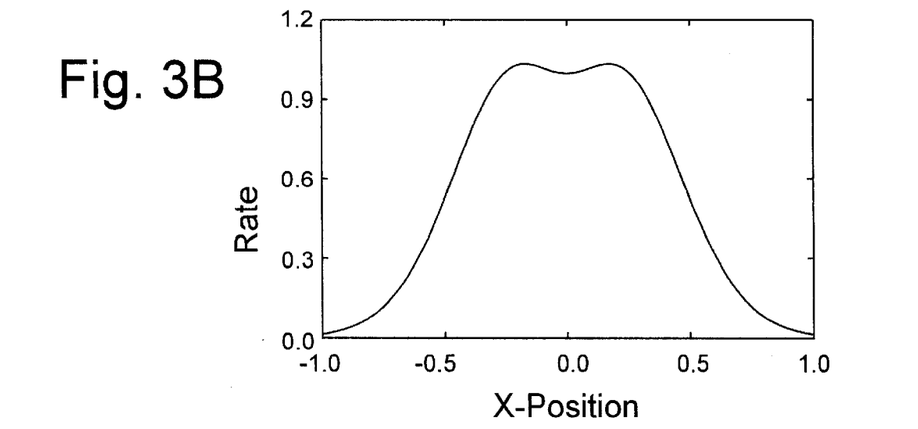
Figure 3C:
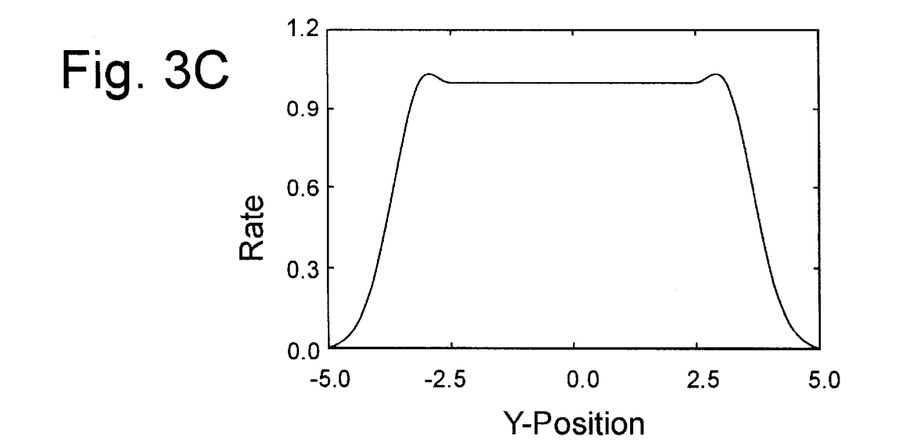

FIGS. 3B and 3C show the deposition rate for a coating source, which, over an area, exhibits a linear geometry. As shown, the x direction is normal to the invariance direction that is the direction with no changes whereas the y direction has a translation variance for a certain range. Preferably, the diodes are arranged along a centerline (X=0) or along two lines which are equally distant from, but at opposite sides of, the centerline (for example X=0.3). Examples are given in FIGS. 8–11.

Figure 4A:
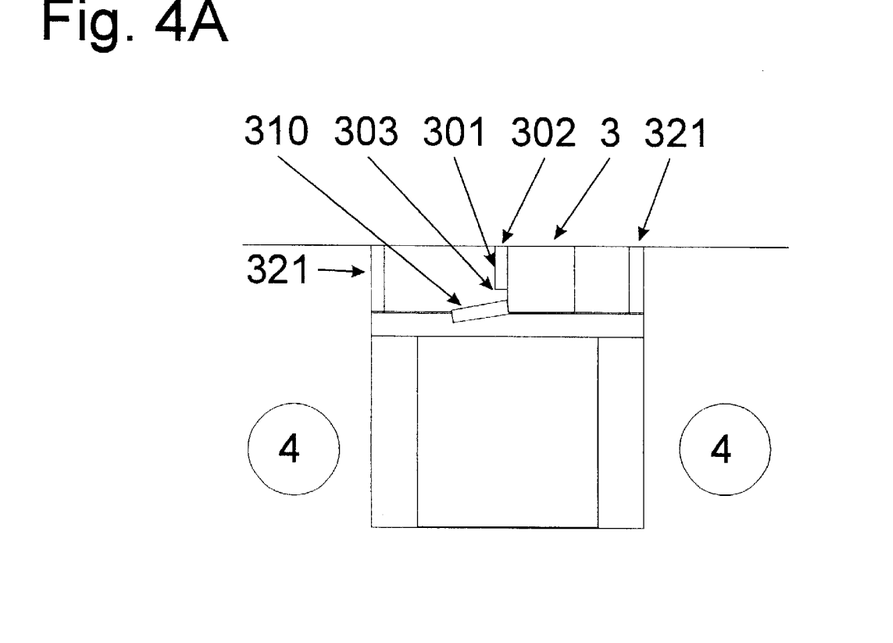
FIGS. 4A and 4B show preferred mounting arrangements for the semiconductor lasers in a laser support.
Figure 4B:
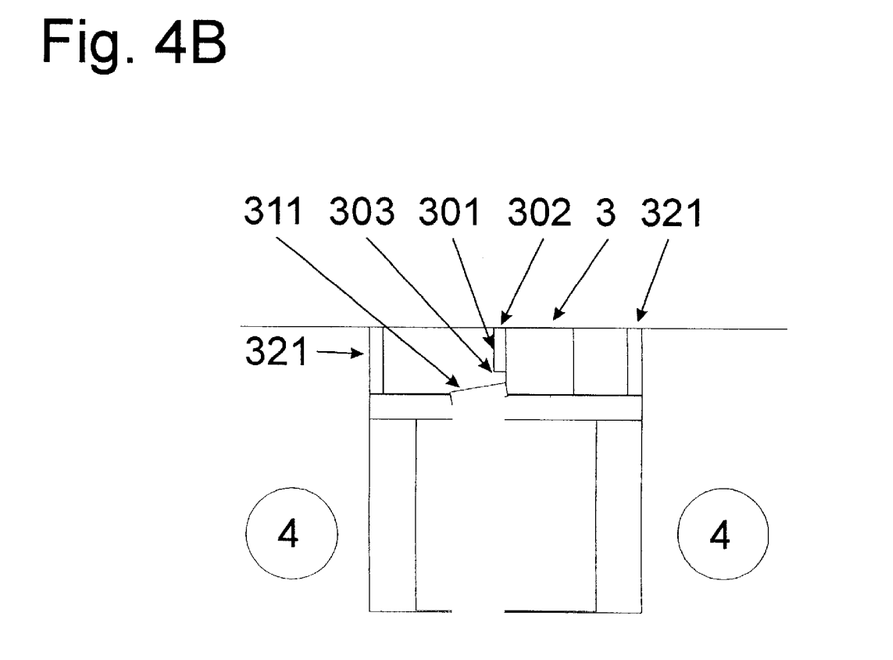

FIGS. 4A, 4B show schematically two mounting arrangements. The semiconductor lasers 3 are held in the laser support structure 4 by a hollow screw 321. The front facet 302 of a laser chip 301 is so oriented that the dielectric coating material is deposited thereon. The rear facet 303 of the laser chip 301 is directed away from the coating procedure. As shown in FIG. 4A, a photodiode 310 is arranged behind the laser, whereby the laser light emitted from the rear facet 303 of the laser can be monitored. In FIG. 4B, a glass fiber 311 is arranged behind the laser 3 in place of the photodiode 310, whereby the light emitted from the rear laser facet can be conducted away out of the receiver for a detailed observation.

Figure 5A:
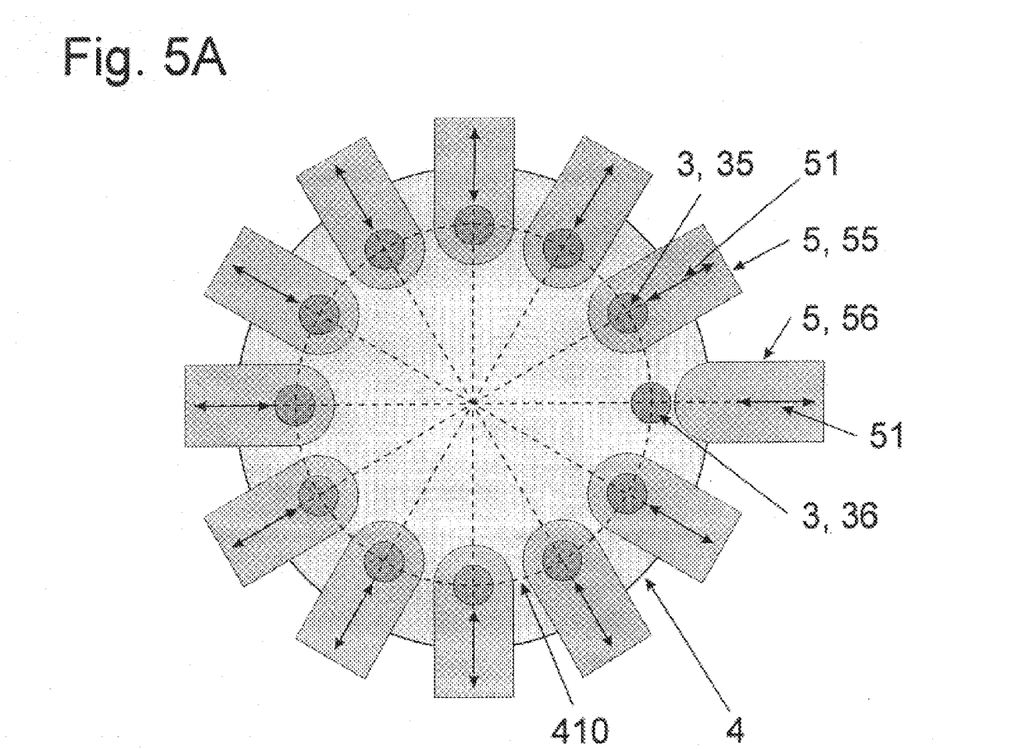
FIGS. 5A, 5B, 6A, 6B and 7A, 7B are schematic representations of preferred arrangements for supporting lasers for a radially symmetrical coating process and shutter arrangement.
Figure 5B:
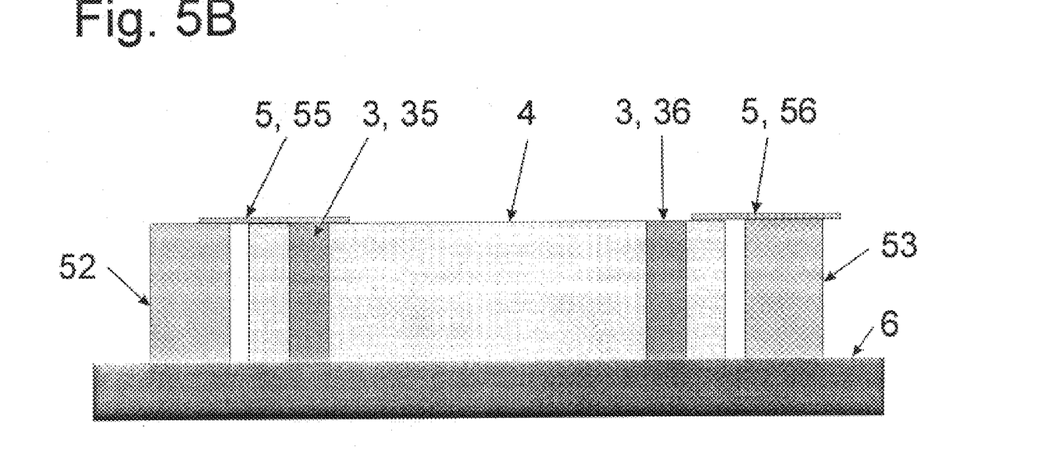

FIGS. 5A and 5B show schematically a laser holder design, that is, a laser magazine for a radially symmetrical coating process. FIG. 5A is a top view of the laser support structure 4 showing also the arrangement of the shutters 5. FIG. 5B is a cross-sectional view of the arrangement of FIG. 5A. The semiconductor lasers 3 are arranged on a line 410 of the same coating rate and the same refraction index. Each laser 3 can be covered individually by a shutter 5, or, if covered, it can be exposed by laterally moving the shutter 5 in the direction of the arrow 51, whereby the laser is exposed to the coating procedure. For movement of the shutter 5 in the direction of the arrow 51, the shutter may be disposed on a slide 52 or, respectively, 53 which is operated by a stepping motor (not shown). The laser 35 is covered by the shutter 55 and consequently protected from being coated. A shutter 56 when moved in the direction of the arrow 51 exposes the laser 36 for coating. With such an arrangement, all semiconductor lasers can first be coated simultaneously while, at the same time, the relevant laser parameters of each laser or observed. Then, upon reaching the most appropriate deposition layer thickness, the various lasers may be covered using the respective shutter. Alternatively, all the lasers are commonly coated up to a certain safe coating thickness. Then, all the lasers, except for one, are covered by the shutters and the deposition layer for the one laser is specifically monitored and optimized individually.

Figure 6A:
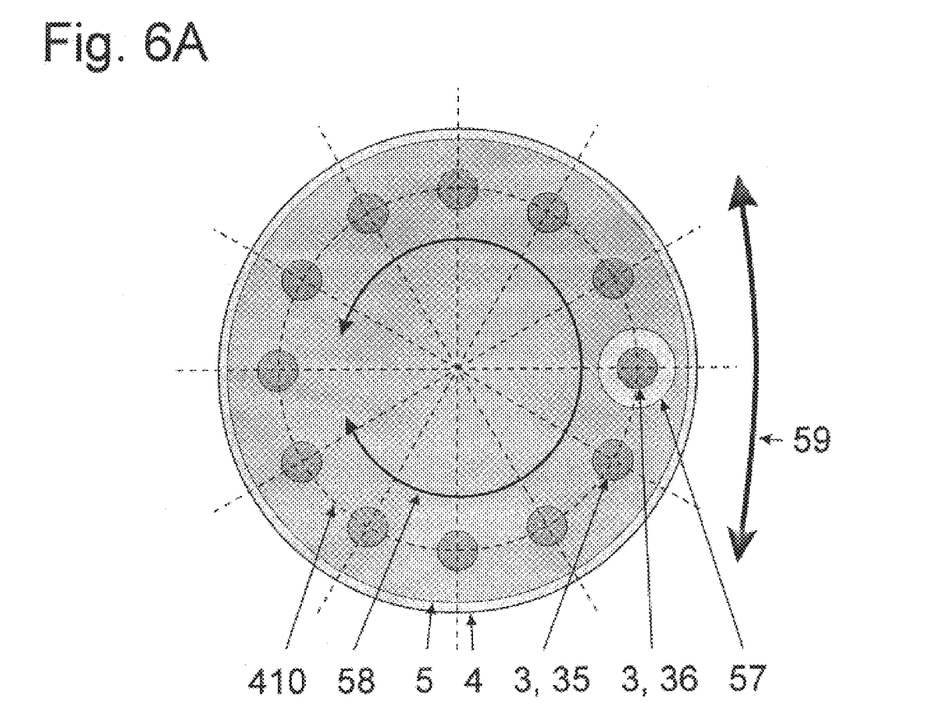
Figure 6B:
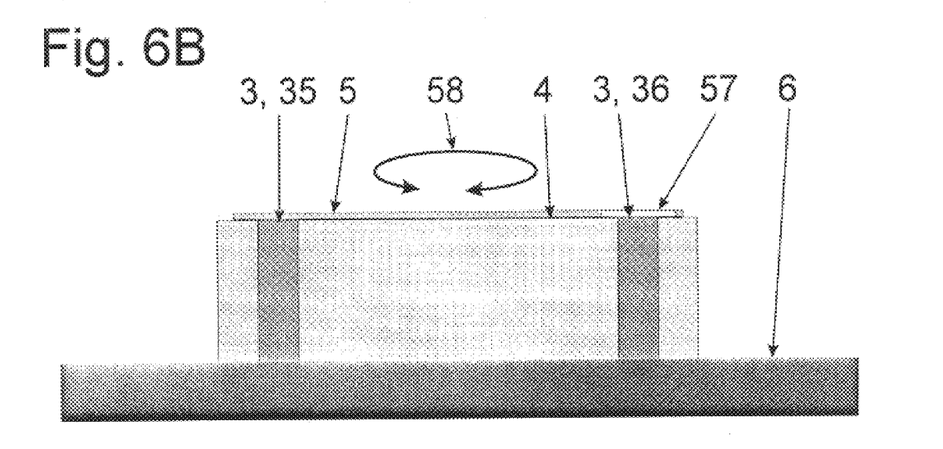

FIGS. 6A and 6B show schematically another embodiment of a laser support structure or magazine 4 for a radially symmetrical coating procedure. FIG. 6A is a top view of the laser support structure showing also the arrangement of the shutter 5. FIG. 6B shows the arrangement in a cross-sectional view. The semiconductor lasers 3 are arranged along a line 410 of the same deposition rate and the same refraction index. The shutter 5 can be moved fully to the side as indicated by the arrow 59, in order to expose all the lasers at the same time to the coating procedure. When the shutter 5 is arranged in front of the laser support structure 4, one opening 57 exposes exactly one laser 3, or respectively, 36. By rotation of the shutter 5 as indicated by the arrow 58, each laser 3 can be individually subjected to the coating process. With the arrangement as shown in FIGS. 6A, 6B, it is also possible to coat the semiconductor lasers first jointly until a safe deposition layer thickness has been reached. Then, all the lasers with the exception of one can be covered by the shutter 5 and the deposition layer can then be optimized individually for the one and then the other lasers.

Figure 7A:
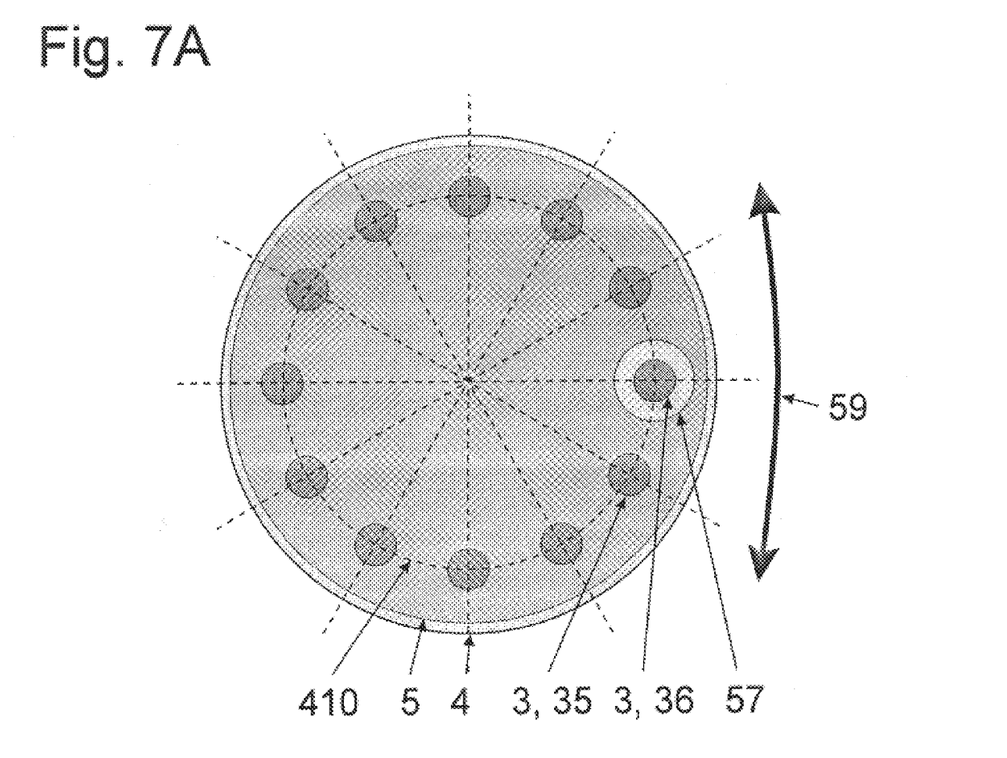
Figure 7B:
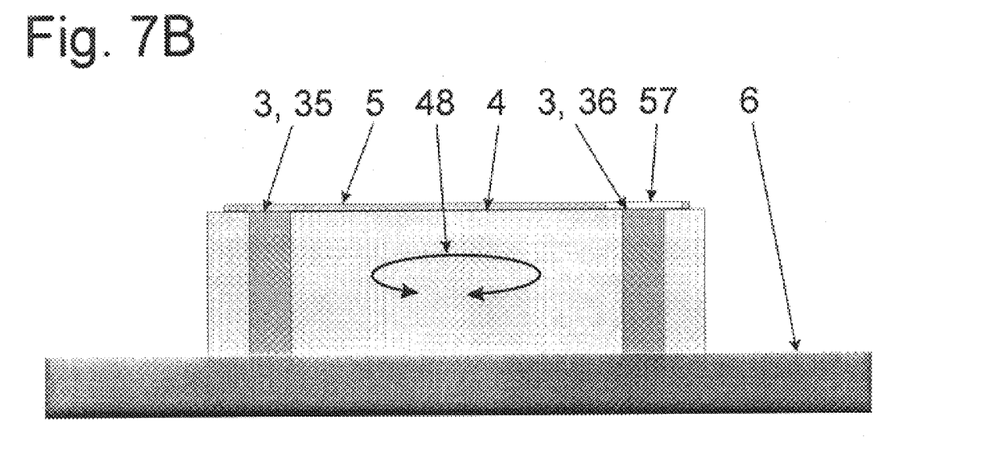

FIG. 7A and 7B show a modification, wherein not the shutter, but the laser support structure 4 is supported so as to be rotatable as indicated by the arrow 48. Otherwise, the coating procedure is the same as described for FIGS. 6A and 6B.

Figure 8A:
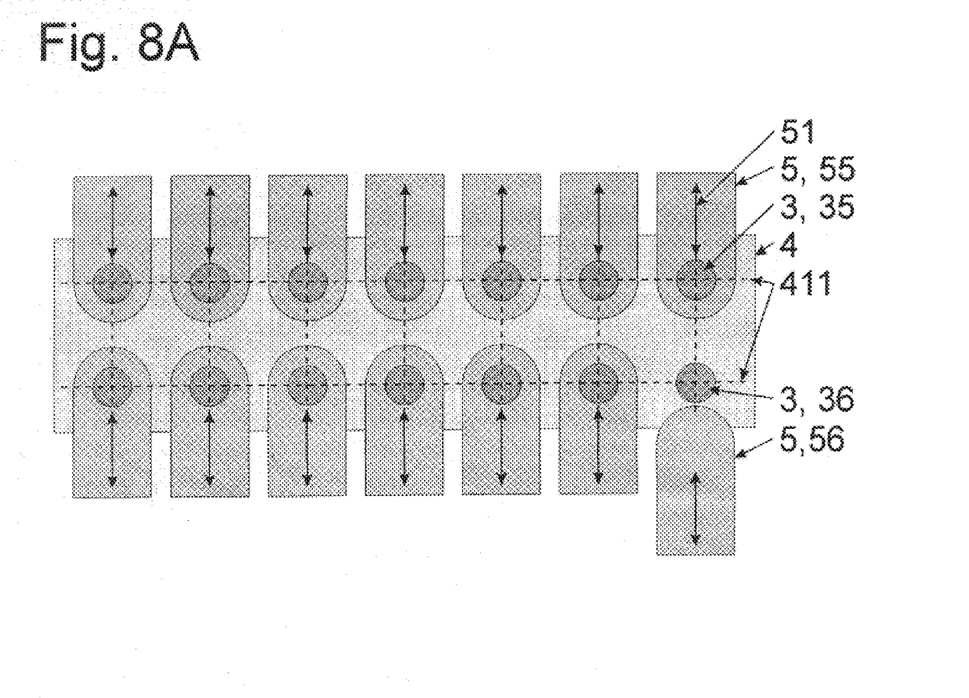
FIGS. 8A, 8B, 9A, 9B, 10A, 10B, 11A, 11B are schematic representations of preferred arrangements for supporting lasers for a linearly symmetrical coating process and shutter arrangement.
Figure 8B:
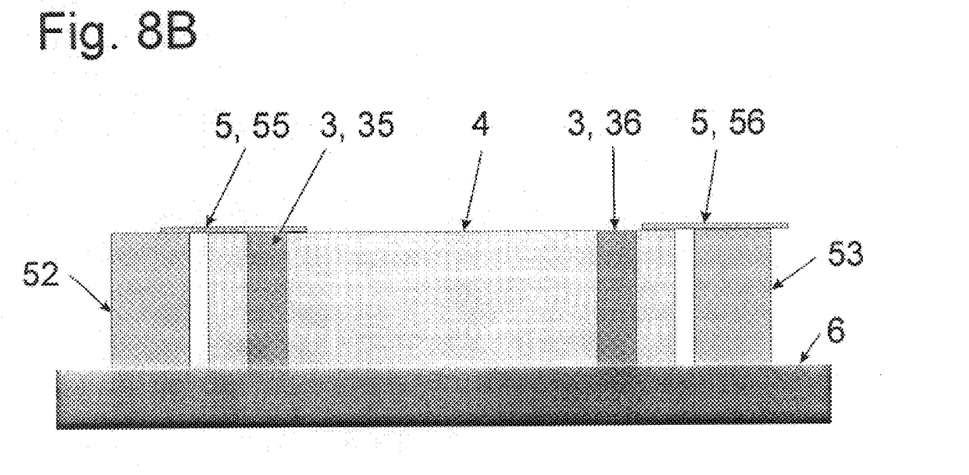

FIGS. 8A and 8B show a preferred arrangement of the laser support structure, or respectively, the laser magazine 4 for a linear-symmetrical coating procedure. FIG. 8A shows the laser support structure 4 in a top view together with the arrangement of the shutters 5. FIG. 8B shows the arrangement in a longitudinal cross-sectional view. The semiconductor lasers 3 are arranged along two lines 411 of the same coating rate and the same refraction index. Each laser can be uncovered individually by a shutter 5 to be exposed to the coating procedure. For example, laser 35 may be covered by the shutter 55 and consequently, is protected from the coating procedure. If the shutter 56 is moved in the direction of the arrow 51, the laser 36 is exposed (as shown). Also with this arrangement, all the semiconductor lasers may first be coated concurrently while the laser parameters of each laser are monitored. Upon reaching a certain coating thickness each laser is individually covered by the associated shutter. Alternatively, all the lasers can coated concurrently up to a certain safe layer thickness whereupon they are covered by the shutters and each is then individually further subjected to the coating procedure for an optimal coating.

Figure 9A:
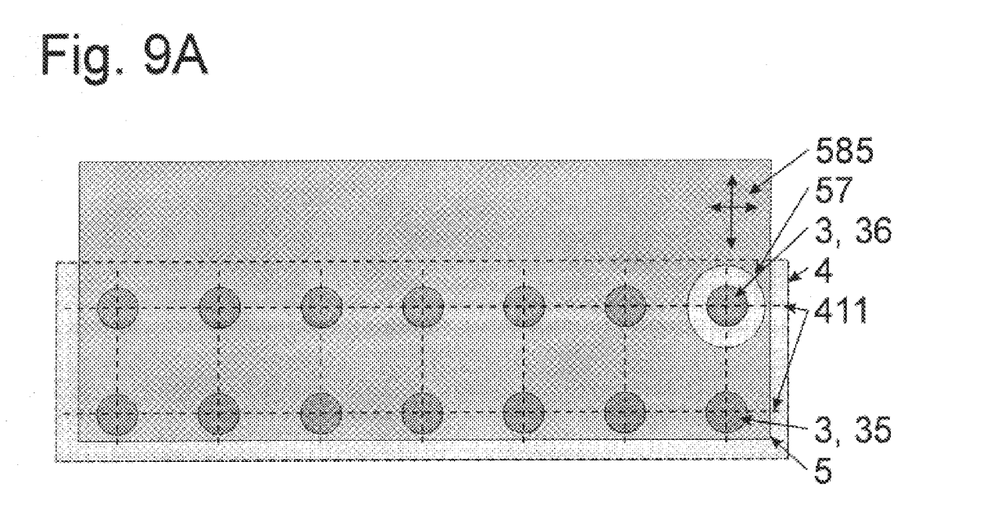
Figure 9B:
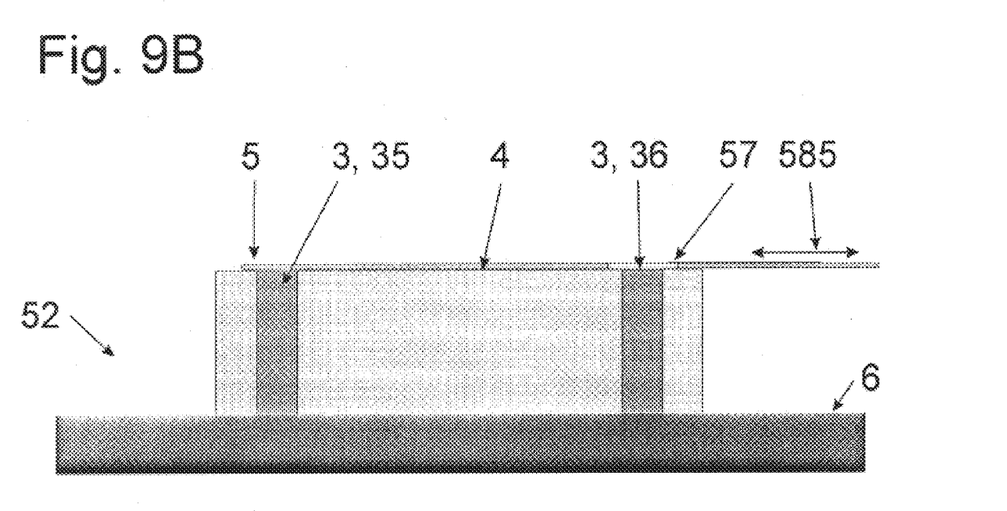

FIGS. 9A and 9B show schematically a modified laser support structure or magazine 4 for linear symmetrical coating. FIG. 9A is a top view of the laser support structure 4 showing also the shutter 5. FIG. 9B shows the arrangement in a longitudinal cross-sectional view. The semiconductor lasers 3 are arranged along two lines 411 of the same deposition rate and the same refraction index. The shutter 5 is movable to the side as indicated by the arrow 585 so that all lasers can be exposed at the same time for coating. As soon as the shutter 5 is disposed in front of the laser support structure 4, an opening 57 formed in the shutter 5 exposes only one single laser 3 or respectively 36 for coating. With the arrangement shown in FIGS. 9A, 9B, it is also possible to first coat all the semiconductor lasers up to a certain safe thickness value and then cover all the lasers by the shutter 5 except for one and successively optimize the coating for each laser individually.

Figure 10A:
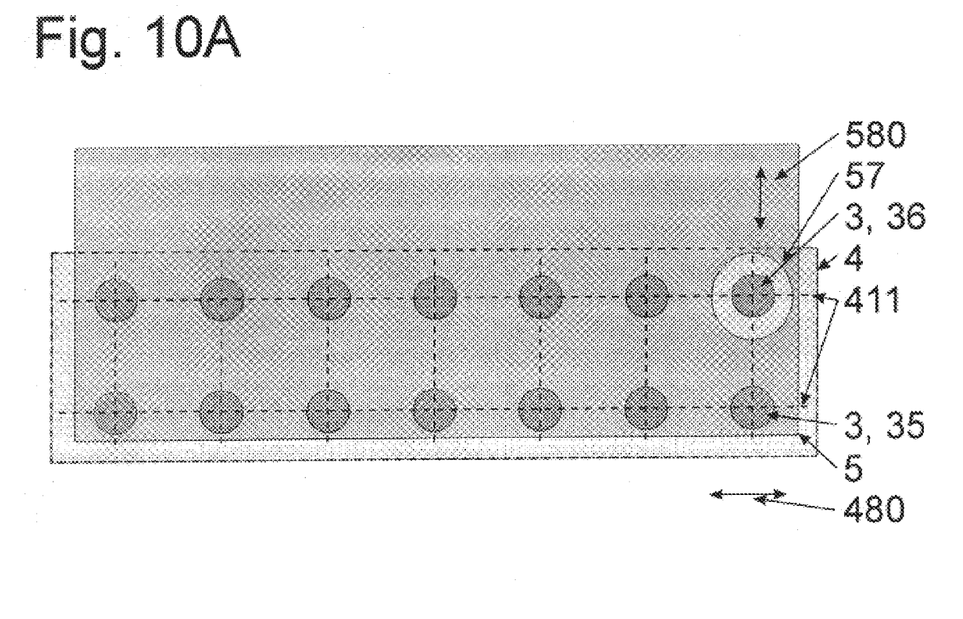
Figure 10B:
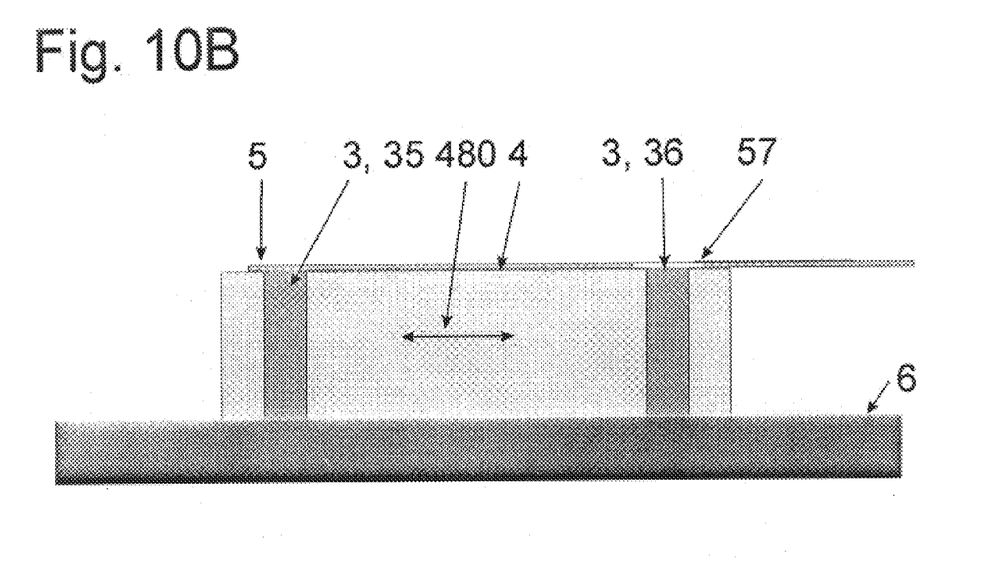

FIGS. 10A and 10B show a modification, wherein the shutter 5 is movable only in one direction as indicated by the arrow 580. But then, the laser support structure 4 can be moved as indicated by the arrow 480. Otherwise, the coating procedure is the same as described with respect to FIGS. 9A, 9B.

Figure 11A:
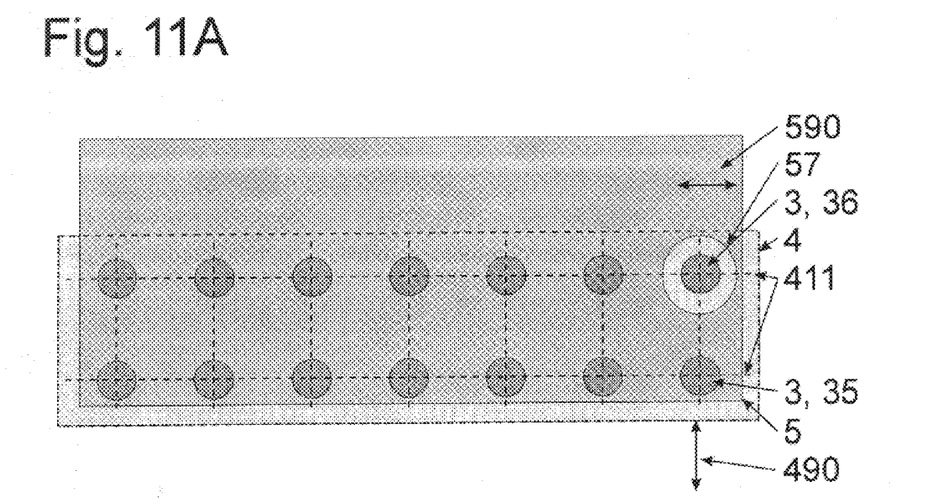
Figure 11B:
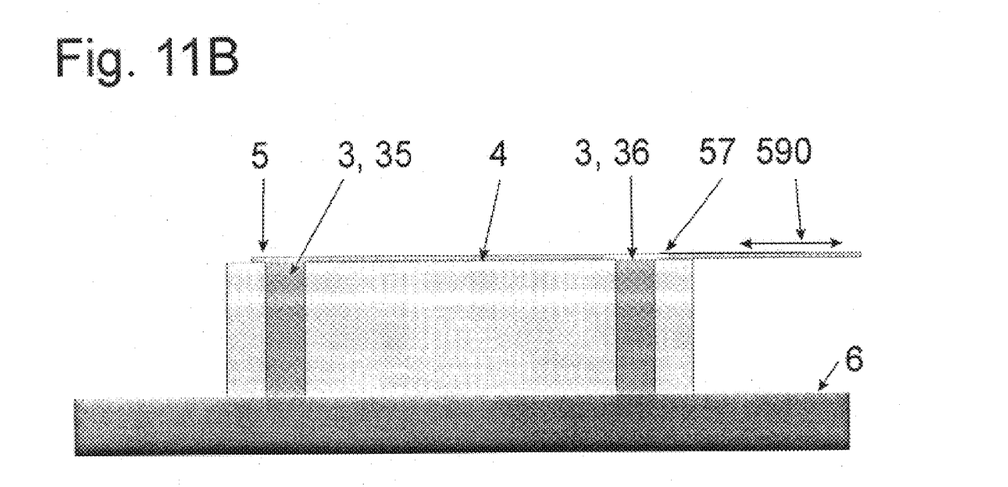

It is also possible to make the shutter 5 movable in the direction of the arrow 590 and the laser holder movable in the direction of the arrow 490 as indicated in FIGS. 11A and 11B.

The invention is not limited to the embodiments as described. Numerous variations are possible within the scope of the invention. In any case, with the present invention the in-situ monitoring of laser diodes during the application of such reflection layers is substantially improved.

High quality coatings can be prepared with the method according to the invention even with a large-scale production, which was not possible with the methods known so far.

In a preferred embodiment of the invention for the manufacture of anti-reflection layers of minimal rest reflectivity for semiconductor laser diodes, the laser light emitted from the front or rear facet of a laser is monitored in-situ. The thickness of the coatings of individual lasers is determined by monitoring the laser parameters in-situ, particularly by comparison with a theoretically calculated time-dependent curve. As laser parameters, the energy or the quantum efficiency of the light emitted by the laser can be used. Selectively, also the wavelength, the electric voltage at the p-n-junction of the laser, or its current threshold can be used as laser parameters. It is also possible to place several semiconductor diode lasers together into a receiver 1 and to use a fully assembled laser 3 as a monitor laser, while additional lasers 3 are simultaneously coated up to a predetermined reference value. Then, each individual laser is further coated with in-situ monitoring of the coating layer. Lasers, which are not yet assembled can be placed into the receiver 1 in the form of chips or bars. A particularly suitable apparatus comprises a coating source 2, at least one movable laser support structure 4 and/or at least one shutter which is arranged in front of the laser and which is selectively movable in front of the laser or lasers during the coating procedure. The laser or lasers can be transferred, including the magazine 11 which forms the support structure, into a coating chamber 14 in which also a pivotally or linearly movable shutter structure 15 is disposed. The lasers 3 may be arranged in an annular or circular array or they may be arranged along a straight line. At least one of the lasers 3 is electrically operated in the receiver 1 and can be monitored by means of a control and measuring arrangement 9 continuously or discontinuously with regard to at least one laser parameter. A control cabinet may contain a laser control 901, a shutter control 921, a layer control 941 and/or a vacuum control 961. The control and measuring arrangement 9, that is, the electronic control system, is operatively connected to the coating source 2, the laser support structure 4 and/or the shutter support structure 5, for example, by electrical and/or optical conductors 19.

What is claimed is:

1. A process for coating at least one of the front and rear facets of semiconductor laser diodes (lasers) with antireflection layers consisting of partial layers of minimal residual reflectivity, comprising the steps of:

placing a plurality of semiconductor lasers in a receiver for concurrent coating of their facets, using one of said lasers in said receiver as a monitor laser, which is monitored to determine the coating state of all of the lasers in said receiver, depositing various coating materials on said facets to form said partial layers, in-situ monitoring at least one laser parameter for determining, on a real time basis, the optimum coating thickness of each of said partial layers for best anti-reflection properties, and terminating the coating procedure for each partial layer when said at least one laser parameter indicates that the optimum thickness of the respective partial layer has been reached, said at least one laser parameter comprising at least one of:

a) the power of the light emitted from at least one of the front and the rear facets
b) the quantum efficiency of the light emitted from at least one of the front and rear facets of the laser,
c) the wavelength of the light emitted by the laser, and
d) a threshold current of said laser.

2. A method according to claim 1, wherein the in-situ monitored laser parameter is compared with a theoretically calculated time behavior of said laser parameter to accurately determine said optimal thickness for terminating the coating procedure.

3. A method according to claim 1, wherein the facets of all of said lasers in said receiver are coated together until the coating reaches a certain reference thickness value and then each individual laser is finish-coated for an optimum coating thickness with in-situ monitoring of at least one of said laser parameters.

4. A method according to claim 1, wherein at least one of said lasers in said receiver is fully assembled before it is placed into said receiver.

5. A method according to claim 4, wherein all but said at least one fully assembled laser are placed into said receiver in the form of chips.

6. A method according to claim 4, wherein all but said at least one finish formed laser are placed into said receiver in the form of bars.

* * * * *